US006683487B2

United States Patent
Takeuchi et al.

(10) Patent No.: US 6,683,487 B2
(45) Date of Patent: Jan. 27, 2004

(54) CURRENT DRIVER CIRCUIT FOR SUPPLYING WRITE CURRENT TO A WRITE HEAD WHILE CHANGING A FLOW DIRECTION OF THE WRITE CURRENT

(75) Inventors: Toru Takeuchi, Tokyo (JP); Takehiko Umeyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/212,702

(22) Filed: Aug. 7, 2002

(65) Prior Publication Data

US 2003/0160640 A1 Aug. 28, 2003

(30) Foreign Application Priority Data

Feb. 28, 2002 (JP) ........................................ 2002-054361

(51) Int. Cl.$^7$ ............................................... H03K 17/56
(52) U.S. Cl. ........................ 327/423; 327/588; 327/110
(58) Field of Search ................................. 327/110, 112, 327/423, 424, 304, 587, 588, 333; 326/30

(56) References Cited

U.S. PATENT DOCUMENTS

| 6,052,017 A | 4/2000 | Pidutti et al. | |
|---|---|---|---|
| 6,121,800 A | * | 9/2000 | Leighton et al. ............ 327/110 |
| 6,157,239 A | * | 12/2000 | Horchler et al. ............ 327/423 |
| 6,236,246 B1 | * | 5/2001 | Leighton et al. ............ 327/424 |
| 6,252,450 B1 | * | 6/2001 | Patti et al. ................... 327/424 |
| 6,292,035 B1 | * | 9/2001 | Takemura .................... 327/110 |
| 6,373,298 B1 | * | 4/2002 | Teterud et al. .............. 327/423 |
| 6,466,388 B1 | * | 10/2002 | Lacombe et al. ........... 327/110 |
| 6,512,646 B1 | * | 1/2003 | Leighton et al. ............ 327/110 |

FOREIGN PATENT DOCUMENTS

| JP | 7-244807 | 9/1995 |
|---|---|---|
| JP | 9-219004 | 8/1997 |
| JP | 11-149605 | 6/1999 |
| JP | 2000-331308 | 11/2000 |

* cited by examiner

Primary Examiner—Toan Tran
(74) Attorney, Agent, or Firm—Leydig, Voit & Mayer, LTD

(57) ABSTRACT

An H-type bridge circuit includes four transistors, two resistors, and a write head. A write current supplied from a current supply circuit including a first of the transistors and resistors flows through the write head and is received in a current receiving circuit including a second of the resistors and a fourth of the transistors, and another write current supplied from a current supply circuit including the second of the transistors and the second resistor flows through the write head and is received in a current receiving circuit including the first of the resistors and the third of the transistors. Impedance of the write head matches an output impedance of the current supply circuit and matches an input impedance of the current receiving circuit.

3 Claims, 8 Drawing Sheets

CURRENT DRIVER CIRCUIT FOR SUPPLYING WRITE CURRENT TO A WRITE HEAD WHILE CHANGING A FLOW DIRECTION OF THE WRITE CURRENT

BACKGROUND OF THE INVENTION

Field of the Invention

The present invention relates to a current driver circuit in which data for a magnetic signal from a write current pre-amplifier is written to a magnetic storing device such as a magnetic disk driven by a hard disk drive (HDD) or a floppy disk drive (FDD).

FIG. 9 is a circuit view showing a conventional current driver circuit. In FIG. 9, Tr1 and Tr2 indicate current drivers including P-channel metal oxide semiconductor (PMOS) transistors respectively. Tr3 and Tr4 indicate current receivers including N-channel metal oxide semiconductor (NMOS) transistors respectively. Tr5 to Tr8 indicate NMOS transistors, respectively. WH indicates a write head for producing a magnetic signal from a write current. CS indicates a current source for supplying a reference current Iref. A voltage of a high voltage source is applied to gates of the current receivers Tr3 and Tr4 and the transistor Tr7 through the current source CS so as to turn on the current receivers Tr3 and Tr4 and the transistor Tr7.

FIG. 10 is a timing chart showing an operation of the circuit.

Next, an operation of the conventional current driver circuit will be described below.

The conventional current driver circuit is shown in FIG. 9 as an example of writing data with a magnetic signal onto a magnetic disk driven by an HDD or the like. Each of the current drivers Tr1 and Tr2 functions as a switch. When a gate terminal A of the current driver Tr1 is set to a low level of V11, the current driver Tr1 is turned on. When a gate terminal B of the current driver Tr2 is set to a low level of V11, the current driver Tr2 is turned on. A current mirror circuit includes the current receivers Tr3 and Tr4 and the transistor Tr7. In cases where a high voltage of Vh2 is applied to a gate terminal of the transistor Tr8, the transistor Tr8 is turned on, and the current mirror circuit functions as a current source circuit. When the transistor Tr5 or Tr6 is turned on, the current mirror circuit functions as a current source circuit. That is, a switching of the current source circuit occurs in the current receivers Tr3 and Tr4 according to the on-off of the transistor Tr5 or Tr6.

The gate terminals A and B of the current drivers and gate terminals C and D of the transistor Tr5 or Tr6 are set to levels respectively as shown in the flow chart of FIG. 10. In a time period T1, the current driver Tr1 and the transistor Tr6 are turned on. Therefore, when the current receiver Tr4 is turned on in the switching operation, a write current Iwc flows through the write head WH in a right direction in FIG. 9. Also, in a time period T2, the current driver Tr2 and the transistor Tr5 are turned on. Therefore, when the current receiver Tr3 is turned on in the switching operation, a write current Iwc flows through the write head WH in a left direction in FIG. 9. The write head WH is formed of a coil. Therefore, a magnetic field is induced in the write head WH due to the write current Iwc flowing through the write head WH, the direction of the magnetic field is changed according to the change of the flow direction of the write current, and a magnetic signal is produced. The write head WH is disposed near to a magnetic disk (not shown), and data of the magnetic signal is written to the magnetic disk.

The current drivers Tr1 and Tr2 and the current receivers Tr3 and Tr4 are disposed in the inside of an integrated circuit, and the current drivers Tr1 and Tr2 and the current receivers Tr3 and Tr4 are connected with external devices (for example, the write head WH) through pins of the integrated circuit. Also, the write head WH is connected with pins of the integrated circuit through inter-connectors.

Recently, a data transfer rate of the magnetic signal has been increased more and more in case of the use of the HDD or the like. To write data of the magnetic signal in the magnetic disk at a high transfer rate, it is required to rapidly change the flow direction of the write current Iwc. Therefore, to heighten the data transfer rate, it is required to shorten both a rise time Tr and a fall time Tf of the write current Iwc. Because an operation frequency has been recently increased, current driving performance of the transistors is temporarily increased during a flow direction changing operation of the write current Iwc. Therefore, the rise time Tr and the fall time Tf of the write current Iwc can be shortened. However, in cases where the impedance matching between the write head WH and a group of pins of the integrated circuit connected with the write head WH is not obtained, energy of the current generated in the integrated circuit is not perfectly consumed as the write current Iwc, and energy not consumed is returned to a current supply end as a reflected component. The returning of the reflected component is called an undershoot phenomenon.

FIG. 11 shows a waveform view showing the undershoot phenomenon. In cases where a degree of the "undershoot" in the phenomenon exceeds a certain level, the magnetic field is not sufficiently induced to write data of the magnetic signal in the magnetic disk. As a result, when the data is read out from the magnetic disk, there is high probability that a reading-out error occurs. Therefore, to heighten the data transfer rate, it is required to solve the problem of the returning of the reflected component, and the impedance matching between the write head WH and the group of pins of the integrated circuit connected with the write head WH is necessary in the current driver circuit.

In the conventional current driver circuit shown in FIG. 9, current flows through the current driver Tr1 or Tr2 functioning as an MOS transistor switch, the write head WH and the line of the current source circuit (that is, a group of the current receiver Tr3 and the transistor Tr5 or a group of the current receiver Tr4 and the transistor Tr6) in that order. An output impedance of the current driver Tr1 or Tr2 is equal to $1/(\beta \times (Vgs-Vth))$, and an input impedance of the current source circuit is equal to $1/(\lambda \times Id)$. Here, Id denotes a drain current. Vgs denotes a difference in voltage between a gate and a source of the current driver Tr1 or Tr2. Vth denotes a threshold voltage of the current driver Tr1 or Tr2. $\beta$ and $\lambda$ are described later. Though the output impedance of the current driver Tr1 or Tr2 and the input impedance of the current source circuit depend on process and bias conditions, the input impedance of the current source circuit is considerably higher than the output impedance of the switch.

An example of an output impedance of the MOS transistor switch and an example of the input impedance of the current source circuit are described. An output resistance of the MOS transistor switch is expressed by Rout(SF), and an input resistance of the current source circuit is expressed by Rin(CS).

$$\mathrm{Rout}(SF) = 1/(\beta \times (Vgs-Vth)) = 1/(k \times (W/L) \times (Vgs-Vth))$$

$$k = \mu n \times Cox = \mu n \times \in ox/tox$$

Here, W denotes a gate width, L denotes a gate length, $\mu n$ denotes a mobility of electrons, Cox denotes a fixed capacitance of an oxide film (SiO$_2$), ∈ox denotes a dielectric constant of the oxide film, and tox denotes a thickness of the oxide film. In the 0.25 μm process, μn=0.05 m$^2$/(V*s), ∈ox=34.5 pF/m and tox=6 nm are satisfied. Therefore, k=290 μA /V$^2$ is obtained. In cases where W=500μm and L=0.25 μm are satisfied, W/L=2000 is obtained. When the write current Iwc set to 50 mA, Vgs set to 2.5 V and Vth set to 0.7 V are satisfied, Rout(SF)=1.4Ω is obtained.

$$Rin(CS)=1/(\lambda \times Iwc))$$

$$\lambda=(1/2L)\sqrt{(2\in s/(q \times Nimp \times (Vds-Veff+\phi o)))}$$

Here, ∈s denotes a dielectric constant of silicon, q denotes an electric charge, Nimp denotes a density of impurities, Vds denotes an electric potential difference between the drain and the source, Veff denotes an effective voltage indicated by an electric potential difference between Vgs (an electric potential difference between gate and source) and Vth (a threshold voltage), and φo denotes a built-in potential. In case of ∈s=Ks×∈o =104 pF/m, Nimp =1×10$^{23}$ m$^{-3}$, Vds =2 V, Veff=Vgs−Vth=0.5 V and φo=0.9 V, λ=0.15 V$^{-1}$ is obtained. Therefore, Rin(CS)=133 Ω is obtained.

Therefore, the input resistance of the current source circuit is considerably higher than the output resistance of the source follower (Rout(SF)<Rin(CS)).

Because the conventional current driver circuit has the above-described configuration, the output impedance of the current driver Tr1 or Tr2 differs from the input impedance of the current source circuit. Therefore, it is difficult to obtain both the impedance matching at a connection point between the current driver Tr1 or Tr2 and the write head WH and the impedance matching at a connection point between the write head WH and the current source circuit. As a result, when data of the magnetic signal is written to the magnetic disk, "undershoot" undesirably occurs, and a problem has arisen that data of the magnetic signal cannot be accurately written to the magnetic disk.

SUMMARY OF THE INVENTION

An object of the present invention is to provide, with due consideration to the drawbacks of the conventional current driver circuit, a current driver circuit in which data is accurately written at high data transfer rate.

The object is achieved by the provision of a current driver circuit which includes a first switching transistor of which one end is connected with a high electric potential power source and of which the other end is connected with a first end of a first resistor, a second switching transistor of which one end is connected with the high electric potential power source and of which the other end is connected with a first end of a second resistor, a third switching transistor of which one end is connected with a low electric potential power source and of which the other end is connected with the first end of the first resistor, a fourth switching transistor of which one end is connected with the low electric potential power source and of which the other end is connected with the first end of the second resistor, and an inductance element of which both ends are connected with a second end of the first resistor and a second end of the second resistor respectively.

Here, a current supply circuit includes a first group of the first switching transistor and the first resistor or a second group of the second switching transistor and the second resistor, and a current receiving circuit includes a first group of the second resistor and the fourth switching transistor or a second group of the first resistor and the third switching transistor. In this case, the inductance element, the current supply circuit and the current receiving circuit are set so as to match both an output impedance of the current supply circuit and an input impedance of the current receiving circuit with an impedance of the inductance element.

Accordingly, even though a current flowing though the inductance element is changed at high frequency to accurately write data to a magnetic storing device at high data transfer rate, the occurrence of "undershoot" can be prevented, and data can be accurately written at high data transfer rate.

DETAILED DESCRIPTION OF THE PREFERRED EMBODIMENTS

Embodiments of the present invention will now be described with reference to the accompanying drawings.

EMBODIMENT 1

Figure 1:
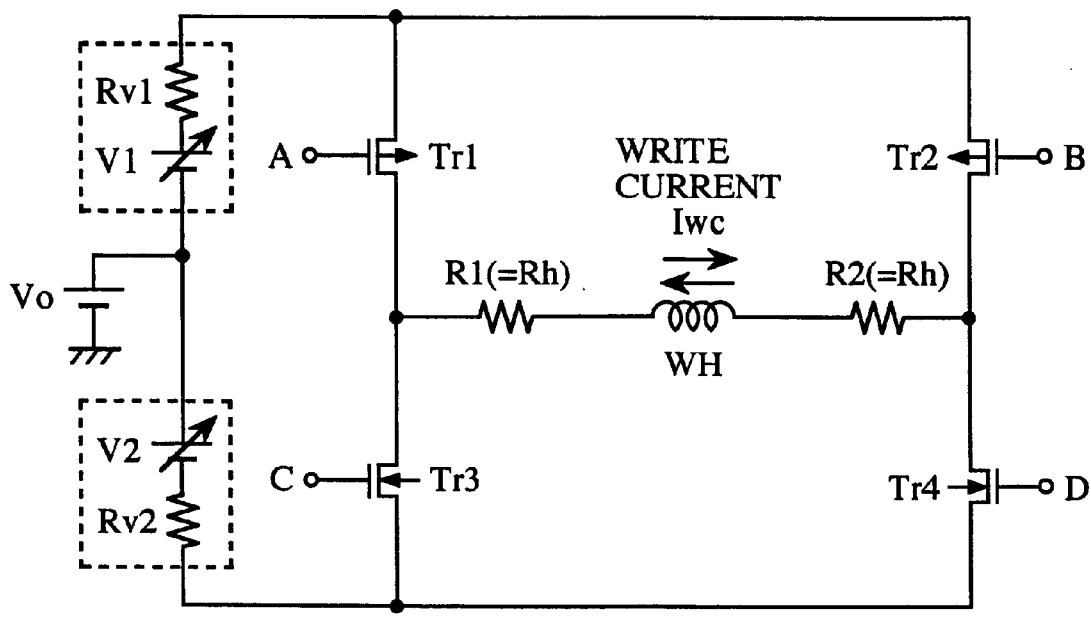
FIG. 1 a circuit view showing a current driver circuit according to a first embodiment of the present invention.

FIG. 1 is a circuit view showing a current driver circuit according to a first embodiment of the present invention.

In FIG. 1, Tr1 indicates a first switching transistor having a gate terminal A, Tr2 indicates a second switching transistor having a gate terminal B, Tr3 indicates a third switching transistor having a gate terminal C, and Tr4 indicates a fourth switching transistor having a gate terminal D. The switching transistors Tr1 and Tr2 disposed on the driver side are formed of PMOS transistors respectively, and the switching transistors Tr3 and Tr4 disposed on the receiver side are formed of NMOS transistors respectively. WH indicates a write head (or an inductance element) formed of an inductance coil, R1 indicates a first resistor having a resistance of Rh, and R2 indicates a second resistor having a resistance of Rh. An H-type bridge circuit comprises the switching transistors Tr1 to Tr4, the write head WH and the resistors R1 and R2. Vo indicates a power source, V1 indicates a tracking power source, V2 indicates a tracking power source, Rv1 indicates an output resistor of the tracking power source V1, and Rv2 indicates an output resistor of the tracking power source V2.

Figure 2:
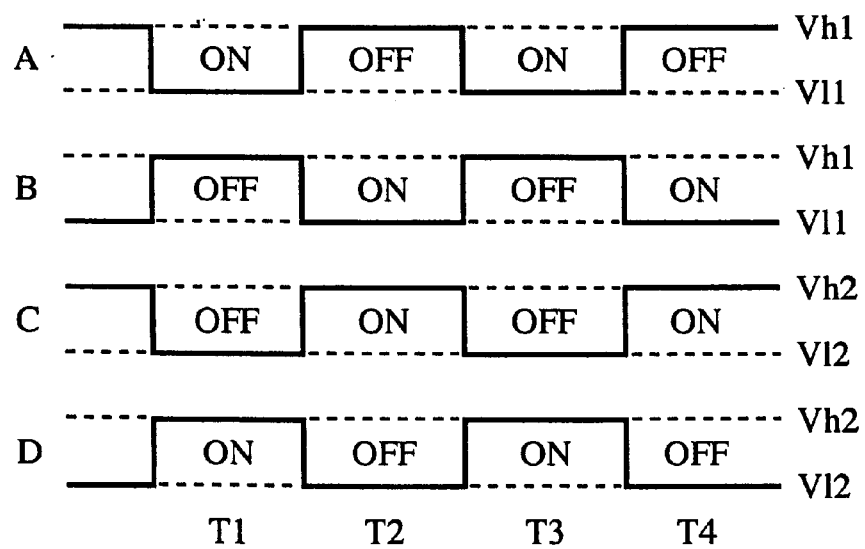
FIG. 2 is a timing chart showing an operation of the current driver circuit shown in FIG. 1.

FIG. 2 is a timing chart showing an operation of the current driver circuit.

Next, an operation of the current driver circuit will be described below.

As shown in FIG. 2, in a time period T1 and a time period T3, the gate terminal A of the transistor Tr1 is set to a low level of Vl1, the gate terminal B of the transistor Tr2 is set to a high level of Vh1, the gate terminal C of the transistor Tr3 is set to a low level of Vl2, and the gate terminal D of the transistor Tr4 is set to a high level of Vh2. In this case, the transistors Tr1 and Tr4 are turned on, the transistors Tr2 and Tr3 are turned off, and a write current Iwc flows through the tracking power source V1, the first switching transistor Tr1, the first resistor R1, the write head WH, the second resistor R2, the fourth switching transistor Tr4 and the tracking power source V2 in that order. Therefore, the write current Iwc flows through the write head WH in the right direction in FIG. 1. Also, in a time period T2 and a time period T4, the gate terminal A of the transistor Tr1 is set to the high level of Vh1, the gate terminal B of the transistor Tr2 is set to the low level of Vl1, the gate terminal C of the transistor Tr3 is set to the high level of Vh2, and the gate terminal D of the transistor Tr4 is set to the low level of Vl2. In this case, the transistors Tr1 and Tr4 are turned off, the transistors Tr2 and Tr3 are turned on, and a write current Iwc flows through the tracking power source V1, the second switching transistor Tr2, the second resistor R2, the write head WH, the first resistor R1, the third switching transistor Tr3 and the tracking power source V2 in that order. Therefore, the write current Iwc flows through the write head WH in the left direction in FIG. 1.

In this case, Vl1 is set to a sufficiently low voltage on condition that the channel of each transistor Tr1 or Tr2 is strongly changed to an inversion layer only in the linear region, and Vh2 is set to a sufficiently high voltage on condition that the channel of each transistor Tr3 or Tr4 is strongly changed to an inversion layer only in the linear region. Therefore, in cases where the switching operation for the transistors Tr1 to Tr4 is performed in the time periods T1 to T4 in that order, the transistors Tr1 to Tr4 are turned on and off in the linear region, and the write current Iwc flows through the write head WH in the right direction and the left direction alternately, a magnetic field is induced by the write current Iwc, the intensity of the magnetic field is changed while changing the flow direction of the write current Iwc, and data indicated by the changing magnetic field is written in a magnetic disk (not shown).

The voltage values of the tracking power sources V1 and V2 are determined so as to set the write current Iwc to a value required of the write head WH. The write current Iwc flowing in the right direction is expressed according to an equation (1).

$$Iwc=(V1+V2-Vds1-Vds4)/(2Rh+Rv1+Rv2+Rwh) \quad (1)$$

Here, V1 and V2 denote the voltage values of the tracking power sources V1 and V2 respectively, Vds1 denotes an electric potential difference between the drain and the source in the first switching transistor Tr1, Vds4 denotes an electric potential difference between the drain and the source in the fourth switching transistor Tr4, Rv1 and Rv2 denote output resistance values of the tracking power sources V1 and V2 respectively and are determined according to the Thevenins theorem, and Rwh denotes a resistance value of the write head WH.

Because the transistors Tr1 and Tr4 are turned on only in the linear region, a drain current Id of the transistor Tr1 or Tr4 is expressed according to an equation (2).

$$Id=(k/2)\times(W/L)\times(2(Vgs\times Vth)\times Vds-Vds^2) \quad (2)$$

In cases where the electric potential difference Vds between the drain and the source is sufficiently low in the transistors Tr1 and Tr4, the second degree term $Vds^2$ can be omitted. Therefore, an output resistance of the transistor Tr1 or Tr4 is equivalent to a resistance Ron of a resistive element.

$$Ron = Vds/Id \quad (3)$$
$$= 1/(k\times(W/L)\times(Vgs-Vth))$$

Because the equation (3) is also satisfied for the transistors Tr2 and Tr3 set to the "on" state in the time period T2 or T4, an equivalent resistance of a transistor TrX (representing the transistors Tr1 to Tr4) is expressed by Ron(TrX). In this case, the write current Iwc expressed according to the equation (1) can be rewritten according to an equation (4).

$$Iwc=(V1+V2)/(2Rh+Rv1+Rv2+Rwh+Ron(Tr1)+Ron(Tr4)) \quad (4)$$

A current supply circuit placed on the driver side comprises the tracking power source V1, the first switching transistor Tr1 and the first resistor R1. In cases where output impedances of the tracking power sources V1 and V2 are expressed by Zv1 and Zv2 respectively, an output impedance Z1 of the current supply circuit is expressed according to an equation (5).

$$Z1=Zv1+Rh+Ron(Tr1) \quad (5)$$

Also, a current receiving circuit placed on the receiver side comprises the second resistor R2, the fourth switching transistor Tr4 and the tracking power source V2, and an input impedance Z2 of the current receiving circuit is expressed according to an equation (6).

$$Z2=Zv2+Rh+Ron(Tr4) \quad (6)$$

Therefore, in cases where the ratio W/L of the gate width to the gate length in each of the transistors Tr1 and Tr4 is appropriately set and the resistance values Rh, Rv1 and Rv2 are appropriately adjusted, the impedance matching between the output impedance Z1 of the current supply circuit and an input impedance Zwh of the write head WH can be obtained, and the impedance matching between an output impedance Zwh of the write head WH and the input impedance Z2 of the current receiving circuit can be obtained. Here, the output impedance Z1 of the current supply circuit denotes an impedance of the current supply circuit seen from a connection point between the first resistor R1 and the write head WH, and the input impedance Zwh of the write head WH denotes an impedance of the write head WH seen from the connection point. Also, the output impedance Zwh of the write head WH denotes an impedance of the write head WH seen from a connection point between the second resistor R2 and the write head WH, and the input impedance Z2 of the current receiving circuit denotes an impedance of the current receiving circuit seen from the connection point.

Accordingly, a magnetic field can be induced by the write current Iwc alternately changed in the right direction and the left direction at high frequency, and data of a magnetic signal indicated by the magnetic field can be written to a magnetic disk (not shown) in accurate at high data transfer rate.

EMBODIMENT 2

Figure 3:
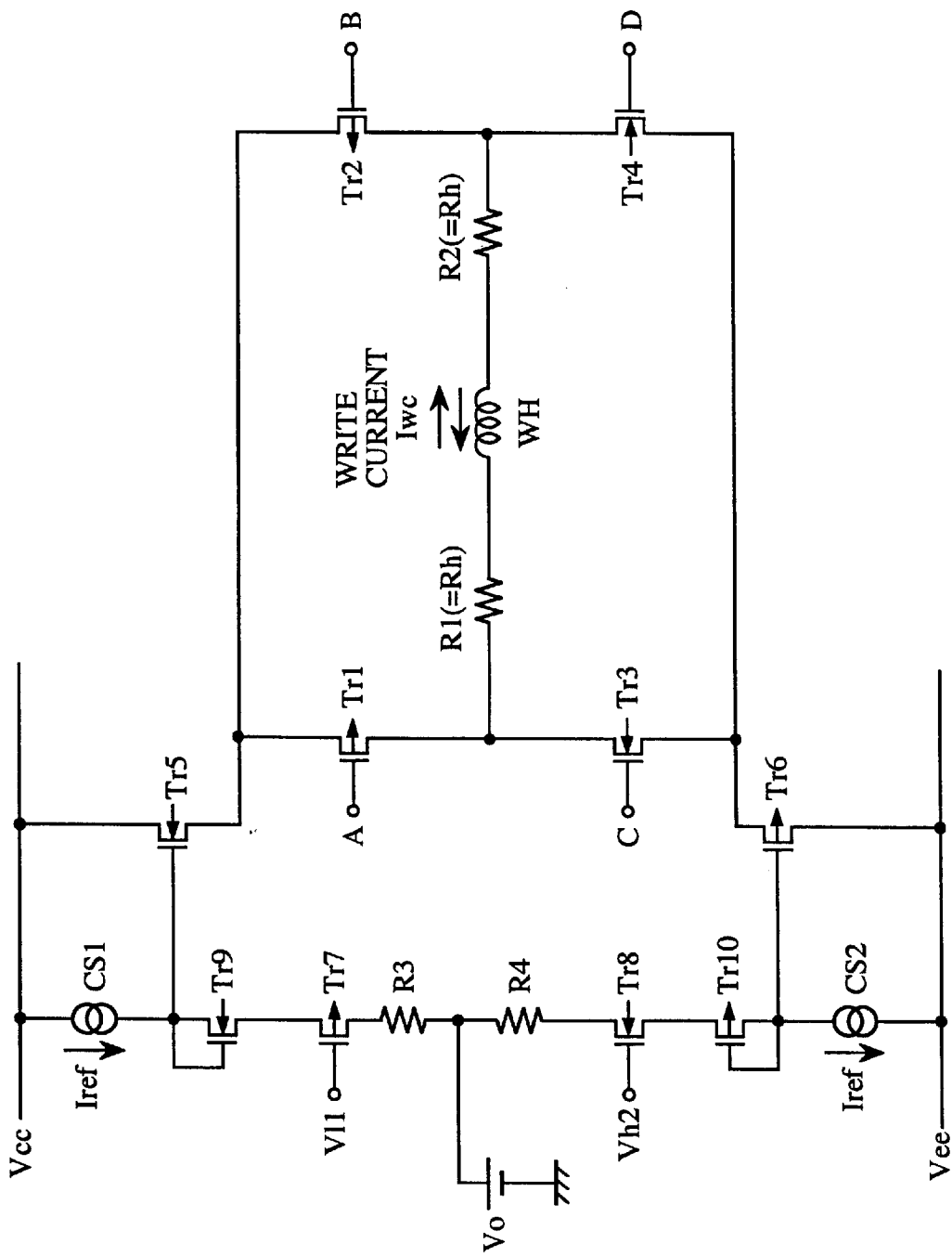
FIG. 3 is circuit view showing a current driver circuit according to a second embodiment of the present invention.

FIG. 3 is a circuit view showing a current driver circuit according to a second embodiment of the present invention.

The constituent elements, which are the same as those shown in FIG. 1, are indicated by the same reference numerals as those of the constituent elements shown in FIG. 1, and additional description of those constituent elements is omitted. In FIG. 3, Tr5, Tr8 and Tr9 indicate a fifth transistor, an eighth transistor and a ninth transistor respectively. The transistors Tr5, Tr8 and Tr9 are formed of NMOS transistors respectively. Tr6, Tr7 and Tr10 indicate a sixth transistor, a seventh transistor and a tenth transistor respectively. The transistors Tr6, Tr7 and Tr10 are formed of PMOS transistors respectively. CS1 and CS2 indicate current sources respectively. R3 and R4 indicate resistors having resistance values R3 and R4 respectively.

Each of the transistors Tr9 and Tr10 is formed in a diode connection in which the gate and the drain are short-circuited each other. The source of the ninth transistor Tr9 is connected to the source of the seventh transistor Tr7, and the source of the tenth transistor Tr10 is connected to the source of the eighth transistor Tr8. The gate voltage V11 is applied to the gate of the seventh transistor Tr7, and the gate voltage Vh2 is applied to the gate of the eighth transistor Tr8. Therefore, the transistors Tr7 and Tr8 are turned on only in the linear region in the same manner as in the transistors Tr1 to Tr4. In the fifth transistor Tr5, the drain is connected with a high potential power source Vcc, the gate is connected with a node at which the gain and the drain of the ninth transistor Tr9 are connected with each other, and the source is connected to the sources of the transistors Tr1 and Tr2. In the sixth transistor Tr6, the drain is connected with a low potential power source Vcc, the gate is connected with a node at which the gain and the drain of the tenth transistor Tr10 are connected with each other, and the source is connected to the sources of the transistors Tr3 and Tr4.

A fixed current Iref is supplied from the current source CS1 to the drain of the ninth transistor Tr9, and the fixed current Iref sent to the drain of the tenth transistor Tr10 is received in the current source CS2. One end of the resistor R3 is connected with the drain of the seventh transistor Tr7, and the other end of the resistor R3 is connected with the power source Vo. One end of the resistor R4 is connected with the drain of the eighth transistor Tr8, and the other end of the resistor R4 is connected with the power source Vo.

Next, an operation of the current driver circuit will be described below. A shown in FIG. 3, the fixed current Iref flows through the ninth transistor Tr9, the seventh transistor Tr7, the resistor R3, the resistor R4, the eighth transistor Tr8 and the tenth transistor Tr10 in that order. Therefore, an electric potential difference Vrefp between the drain of the ninth transistor Tr9 and the other end of the resistor R3 is expressed according to an equation (7).

$$Vrefp = R3 \times Iref + vds7 + Vgs9 \quad (7)$$

Here, VdsX denotes an electric potential difference between the drain and the source in the transistor TrX, VgsX denotes an electric potential difference between gate and source in the transistor TrX, and the transistor TrX (X=1 to 10) represents the transistor Tr1 to Tr10.

Also, an electric potential difference Vrefn between the other end of the resistor R4 and the drain of the eighth transistor Tr8 is expressed according to an equation (8).

$$Vrefn = R4 \times Iref + Vds8 + Vgs10 \quad (8)$$

Therefore, an electric potential difference between the gates of the transistors Tr5 and Tr6 is expressed by Vrefp+Vrefn.

When the transistors Tr1 and Tr4 are set to the "on" state while setting the transistors Tr2 and Tr3 to the "off" state, a write current Iwc is expressed according to an equation (9).

$$\begin{aligned} Iwc &= (Vrefp + Vrefn - Vgs5 - Vds1 - Vds4 - Vgs6) / \\ &\quad (2Rh + Rwh) \\ &= ((R3 + R4) \times Iref + Vds7 + Vds8 + Vgs9 + Vgs10 - \\ &\quad Vgs5 - Vds1 - Vds4 - Vgs6) / (2Rh + Rwh) \end{aligned} \quad (9)$$

In cases where the transistors Tr1, Tr4, Tr5, Tr6, Tr7, Tr8, Tr9 and Tr10 are formed so as to satisfy Vds1=Vds7, Vds4=Vds8, Vgs6=Vgs10 and Vgs5=Vgs9, the equation (9) can be rewritten to an equation (10).

$$Iwc = ((R3+R4)/(2Rh+Rwh)) \times Iref \quad (10)$$

In this case, the voltage at the source terminal of the fifth transistor Tr5 corresponds to the voltage value V1 of the tracking power source V1 shown in FIG. 1, and the voltage at the source terminal of the sixth transistor Tr6 corresponds to the voltage value V2 of the tracking power source V2 shown in FIG. 1. Also, an output impedance Zv1 of the source follower using the fifth transistor Tr5 corresponds to the output impedance Rv1 of the tracking power source V1, and an output impedance Zv2 of the source follower using the sixth transistor Tr6 corresponds to the output impedance Rv2 of the tracking power source V2. Therefore, the output impedances Zv1 and Zv2 are expressed according to equations (11) and (12).

$$Zv1 = d(Vgs5)/d(Id) \\ = 1/\sqrt{(2\beta(Tr5) \times Iwc)} \quad (11)$$

$$Zv2 = d(Vgs6)/d(Id) \\ = 1/\sqrt{(2\beta(Tr6) \times Iwc)} \quad (12)$$

Here, $\beta$ (Tr5) and $\beta$ (Tr6) denote $\beta$ for the transistors Tr5 and Tr6 respectively, and $\beta$ is defined in the prior art.

A current supply circuit placed on the driver side comprises the source follower of the fifth transistor Tr5, the first switching resistor Tr1 and the first resistor R1. An output impedance Z1 of the current supply circuit is expressed according to an equation (13) by referring to the equation (5).

$$Z1 = Rh + Ron(Tr1) + Zv1 \quad (13)$$

Also, a current receiving circuit placed on the receiver side comprises the second resistor R2, the fourth switching transistor Tr4 and the source follower of the sixth transistor Tr6, and an input impedance Z2 of the current receiving circuit is expressed according to an equation (14) by referring to the equation (6).

$$Z2 = Rh + Ron(Tr4) + Zv2 \quad (14)$$

Therefore, in cases where the ratios W/L in the transistors Tr1 to Tr4 and the values Rh, Zv1 and Zv2 are appropriately set, the relationship Z1=Z2=Zwh/2 is obtained. As a result, the impedance matching between the output impedance Z1 of the current supply circuit and the input impedance Zwh of the write head WH can be obtained, and the impedance matching between the output impedance Zwh of the write head WH and the input impedance Z2 of the current receiving circuit can be obtained.

Accordingly, data can be written to a magnetic disk (not shown) in accurate at high data transfer rate.

EMBODIMENT 3

Figure 4:
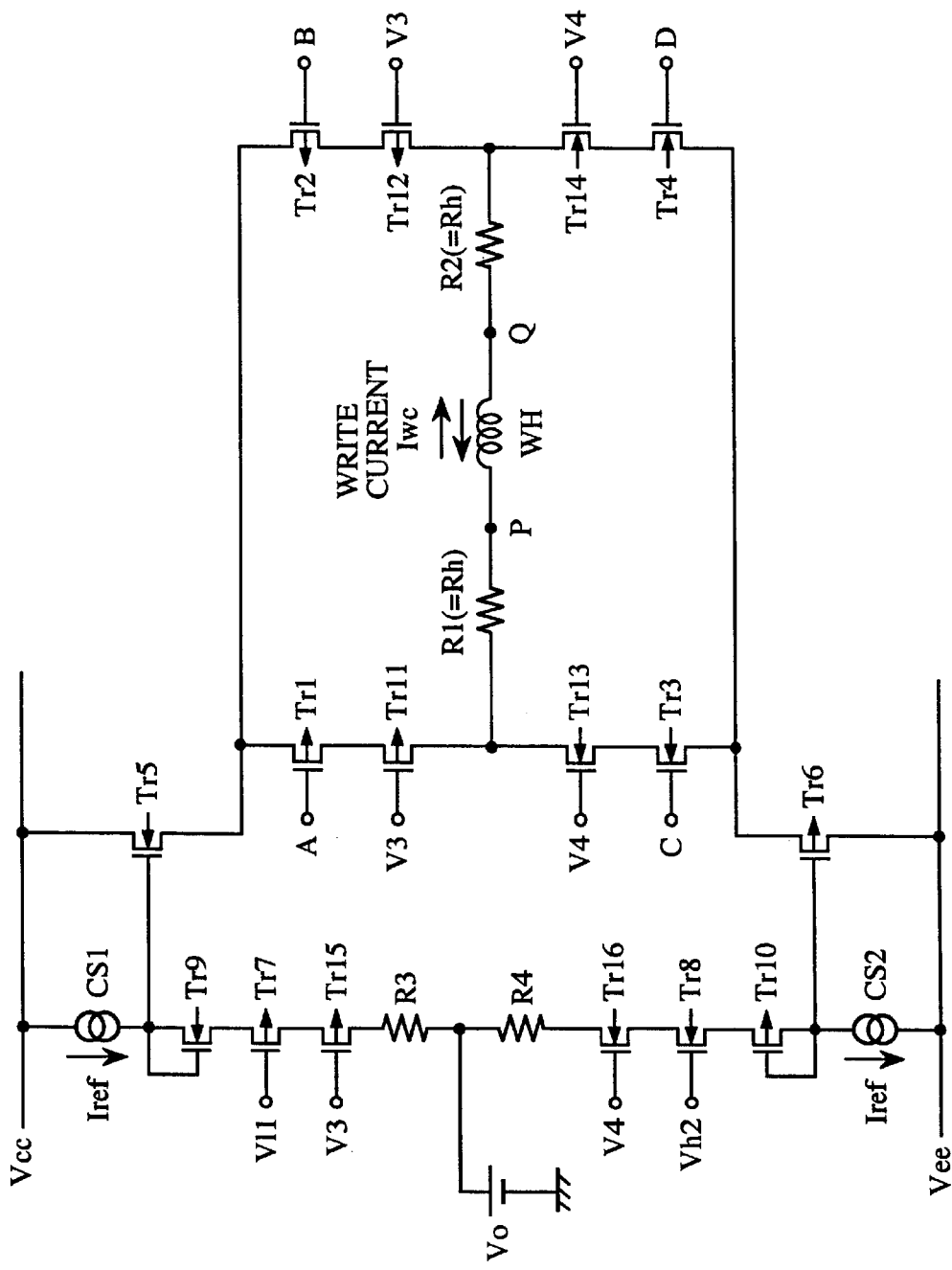
FIG. 4 is a circuit view showing a current driver circuit according to a third embodiment of the present invention.

FIG. 4 is a circuit view showing a current driver circuit according to a third embodiment of the present invention. The constituent elements, which are the same as those shown in FIG. 3, are indicated by the same reference numerals as those of the constituent elements shown in FIG. 3, and additional description of those constituent elements is omitted.

In FIG. 4, Tr11, Tr12 and Tr15 indicate gate-grounded transistors formed of PMOS transistors respectively. A gate electric potential V3 is applied to the gates of the gate-grounded transistors Tr11, Tr12 and Tr15. Tr13, Tr14 and Tr16 indicate gate-grounded transistors formed of NMOS transistors respectively. A gate electric potential V4 is applied to the gates of the gate-grounded transistors Tr13, Tr14 and Tr16. The source of the gate-grounded transistor Tr11 is connected with the drain of the first switching transistor Tr1 to reduce the electric potential difference Vds1 between the drain and the source of the transistor Tr1. The source of the gate-grounded transistor Tr12 is connected with the drain of the second switching transistor Tr2 to reduce the electric potential difference Vds2 between the drain and the source of the transistor Tr2. The source of the gate-grounded transistor Tr13 is connected with the drain of the third switching transistor Tr3 to reduce the electric potential difference Vds3 between the drain and the source of the transistor Tr3. The source of the gate-grounded transistor Tr14 is connected with the drain of the fourth switching transistor Tr4 to reduce the electric potential difference Vds4 between the drain and the source of the transistor Tr4. The sources of the gate-grounded transistors Tr15 and T16 are connected with the drains of the transistor Tr7 and Tr8 respectively to set the relationship of electric potentials of the transistor Tr7 and Tr8 symmetrically to the relationship of electric potentials of the transistor Tr1 and Tr4 (or Tr2 and Tr3).

Next, an operation of the current driver circuit will be described below.

An impedance of the inductance component L of the write head WH for a frequency component f of the write current Iwc is equal to $2\pi fL$. Therefore, the higher the frequency f, the higher the impedance. In cases where the flow direction of the write current Iwc is changed at higher frequency to heighten the frequency f, because the write current Iwc is changed according to a very small time constant, the impedance of the write head WH is considerably increased.

Figure 5:
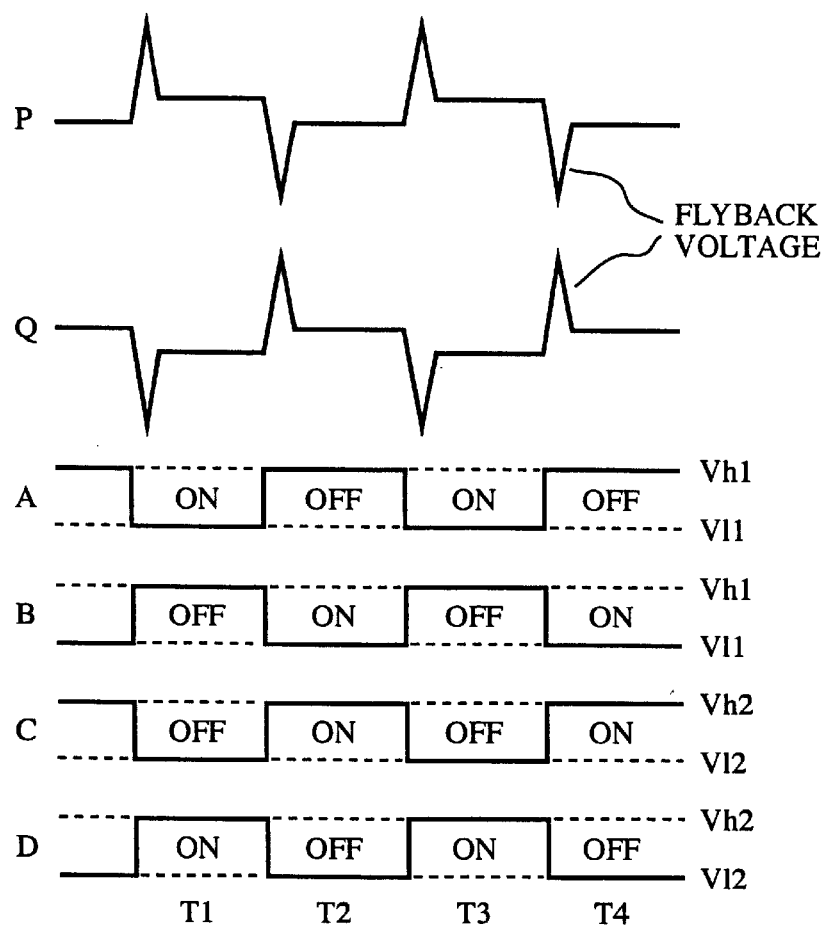
FIG. 5 is a waveform view showing a flyback voltage phenomenon h occurs in the current driver circuit shown in FIG. 4.
Figure 9:
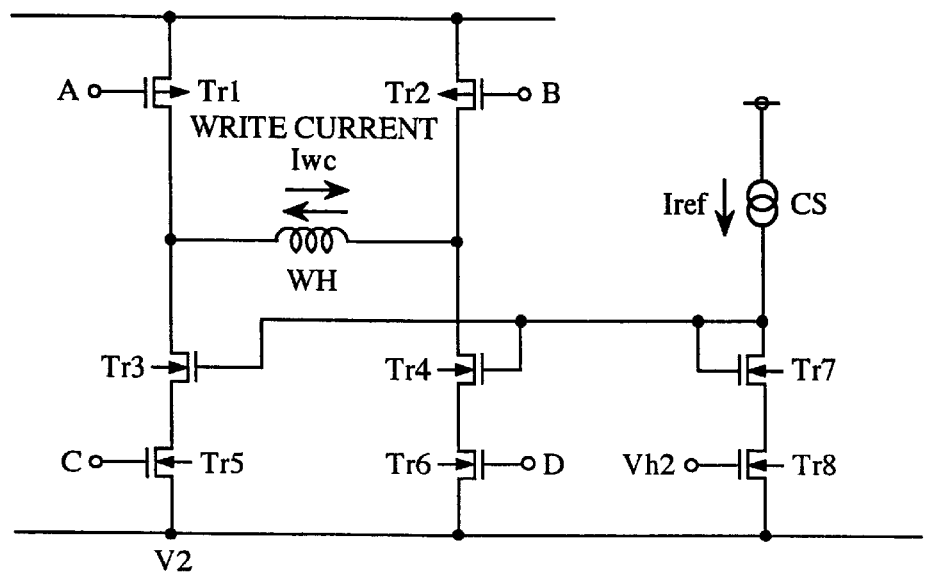
FIG. 9 is a circuit view showing a conventional current driver circuit.

FIG. 5 is a waveform view showing a flyback voltage phenomenon.

Because the impedance of the write head WH is considerably increased, as shown in FIG. 5, a high voltage called a flyback voltage is applied between both ends P and Q of the write head WH each time the flow direction of the write current Iwc is changed. Because the flyback voltage is applied to the switching transistors Tr1 to Tr4 through the resistors R1 and R2, protective transistors are required for the switching transistors Tr1 to Tr4 according to the values Vds of the switching transistors Tr1 to Tr4.

As shown in FIG. 4, an electric potential difference Vrefp between the drain of the ninth transistor Tr9 and the other end of the resistor R3 is expressed according to an equation (15).

$$Vrefp = R3 \times Iref + Vds7 + Vgs9 + Vds15 \tag{15}$$

Here, Vds15 denotes an electric potential difference between the drain and the source in the transistor Tr15.

Also, an electric potential difference Vrefn between the other end of the resistor R4 and the drain of the eighth transistor Tr8 is expressed according to an equation (16).

$$Vrefn = R4 \times Iref + Vds8 + Vgs10 + Vds16 \tag{16}$$

Here, Vds16 denotes an electric potential difference between the drain and the source in the transistor Tr16.

When the switching transistors Tr1 and Tr4 are set to the "on" state while setting the switching transistors Tr2 and Tr3 to the "off" state, a write current Iwc is expressed according to an equation (17) similar to the equation (9).

$$\begin{aligned} Iwc &= (Vrefp + Vrefn - Vgs5 - Vds1 - Vds4 - Vgs6 - \\ &\quad Vds11 - Vds14)/(2Rh + Rwh) \\ &= ((R3 + R4) \times Iref + Vds7 + Vds8 + Vgs9 + Vgs10 - \\ &\quad -Vgs5 - Vds1 - Vds4 - Vds6 - Vds11 - Vds14 + \\ &\quad Vds15 + Vds16)/(2Rh + Rwh) \end{aligned} \tag{17}$$

In cases where the transistors Tr1, Tr4, Tr5, Tr6, Tr7, Tr8, Tr9, Tr10, Tr11, Tr14, Tr15 and Tr16 are formed so as to satisfy Vds1=Vds7, Vds4=Vds8, Vgs6=Vgs10, Vgs5=vgs9, Vds11=Vds15 and Vds14=Vds16, the equation (17) can be rewritten to an equation (18).

$$Iwc = ((R3+R4)/(2Rh+Rwh)) \times Iref \tag{18}$$

The equation (18) is the same as the equation (10). A current supply circuit placed on the driver side comprises the source follower of the fifth transistor Tr5, the first switching resistor Tr1, the transistor Tr11 and the first resistor R1. Therefore, an output impedance Z1 of the current supply circuit is expressed according to an equation (19) similar to the equation (13).

$$Z1 = Rh + Ron(Tr1) + Ron(Tr11) + Zv1 \tag{19}$$

Also, a current receiving circuit placed on the receiver side comprises the second resistor R2, the transistor Tr14, the fourth switching transistor Tr4 and the source follower of the sixth transistor Tr6. Therefore, an input impedance Z2 of the current receiving circuit is expressed according to an equation (20) similar to the equation (14).

$$Z2 = Rh + Ron(Tr4) + Ron(Tr14) + Zv2 \tag{20}$$

Therefore, in cases where the ratios W/L in the transistors Tr1 to Tr4 and Tr11 to Tr14 and the values Rh, Zv1 and Zv2 are appropriately set, the relationship Z1=Z2=Zwh/2 is obtained. As a result, the impedance matching between the output impedance Z1 of the current supply circuit and the input impedance Zwh of the write head WH can be obtained, and the impedance matching between the output impedance Zwh of the write head WH and the input impedance Z2 of the current receiving circuit can be obtained.

Accordingly, data can be written to a magnetic disk (not shown) in accurate at high data transfer rate.

EMBODIMENT 4

Figure 6:
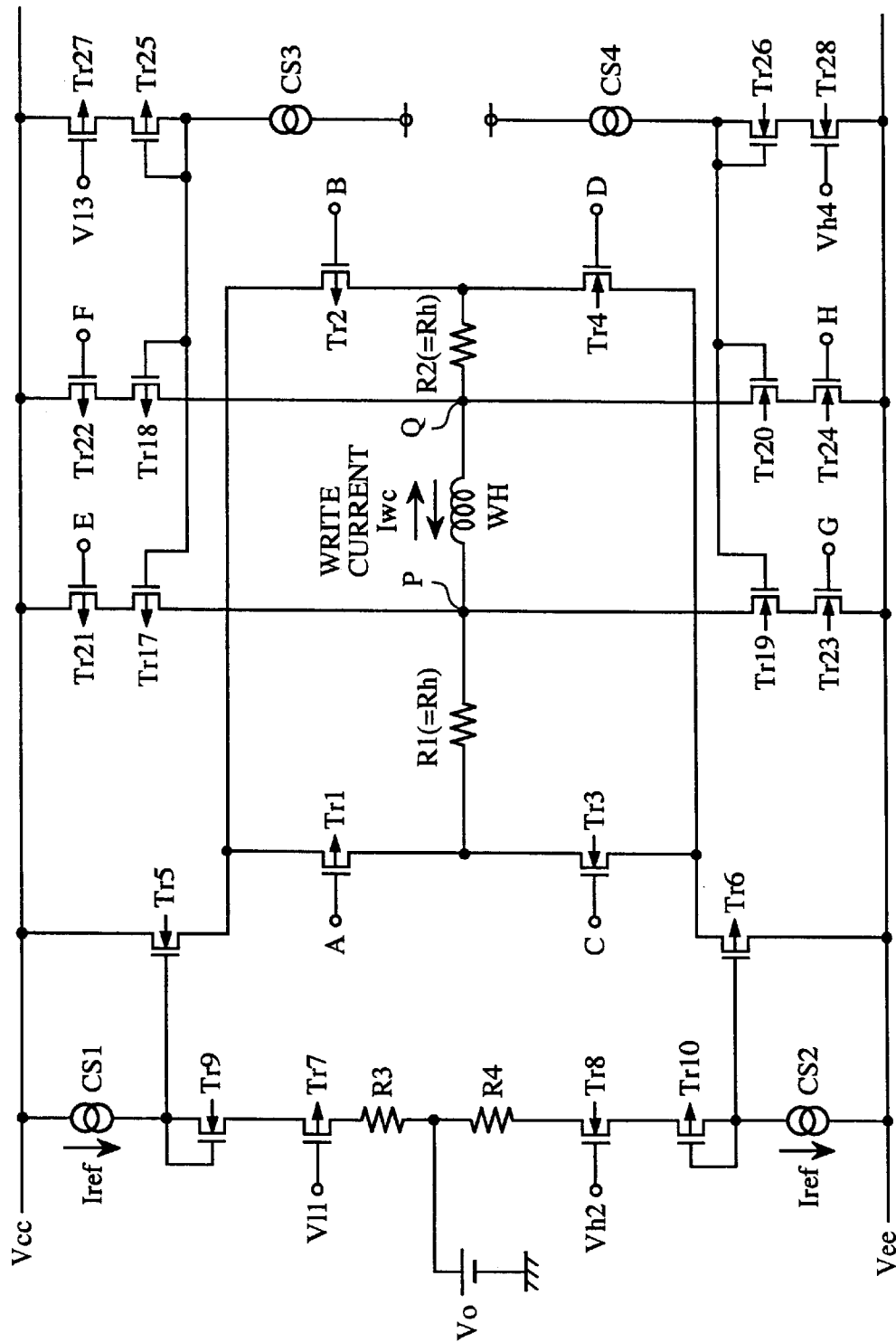
FIG. 6 is a circuit view showing a current driver circuit according to a fourth embodiment of the present invention.

FIG. 6 is a circuit view showing a current driver circuit according to a fourth embodiment of the present invention. The constituent elements, which are the same as those shown in FIG. 3, are indicated by the same reference numerals as those of the constituent elements shown in FIG. 3, and additional description of those constituent elements is omitted.

In FIG. 6, Tr17, Tr18, Tr21, Tr22, Tr25 and Tr27 indicate transistors formed of PMOS transistors respectively, and Tr19, Tr20, Tr23, Tr24, Tr26 and Tr28 indicate transistors formed of NMOS transistors respectively. CS3 and CS4 indicate current sources respectively.

A current source circuit has the transistors Tr17, Tr18, Tr21, Tr22, Tr25 and Tr27 disposed on the high electric potential side and the transistors Tr19, Tr20, Tr23, Tr24, Tr26 and Tr28 disposed on the low electric potential side. On the high electric potential side, the drain and the gate of the transistor Tr25 are connected with each other in the diode connection. The gates of the transistors Tr17, Tr18 and Tr25 are connected with each other to be set to a common voltage. Therefore, a current mirror circuit comprises the transistors Tr17, Tr18 and Tr25. Also, the gates of the transistors Tr17, Tr18 and Tr25 are connected with the current source CS3 so that the transistors Tr17, Tr18 and Tr25 are set to the "on" state. The drains of the transistors Tr21, Tr22 and Tr27 are connected with the sources of the transistors Tr17, Tr18 and Tr25 respectively, and the sources of the transistors Tr21, Tr22 and Tr27 are connected with the high potential power source Vcc. A fixed low voltage V13 is always applied to the gate of the transistor Tr27 to always set the transistor Tr27 to the "on" state. Therefore, the transistor Tr27 functions as a resistive element.

On the low electric potential side, the drain and the gate of the transistor Tr26 are connected with each other in the diode connection. The gates of the transistors Tr19, Tr20 and Tr26 are connected with each other to be set to a common voltage. Therefore, a current mirror circuit comprises the transistors Tr19, Tr20 and Tr26. Also, the gates of the transistors Tr19, Tr20 and Tr26 are connected with the current source CS4 so that the transistors Tr19, Tr20 and Tr26 are set to the "on" state. The drains of the transistors Tr23, Tr24 and Tr28 are connected with the sources of the transistors Tr19, Tr20 and Tr26 respectively, and the sources of the transistors Tr23, Tr24 and Tr28 are connected with the low potential power source Vee. A fixed high voltage Vh4 is always applied to the gate of the transistor Tr28 to always set the transistor Tr28 to the "on" state. Therefore, the transistor Tr28 functions as a resistive element.

Figure 7:
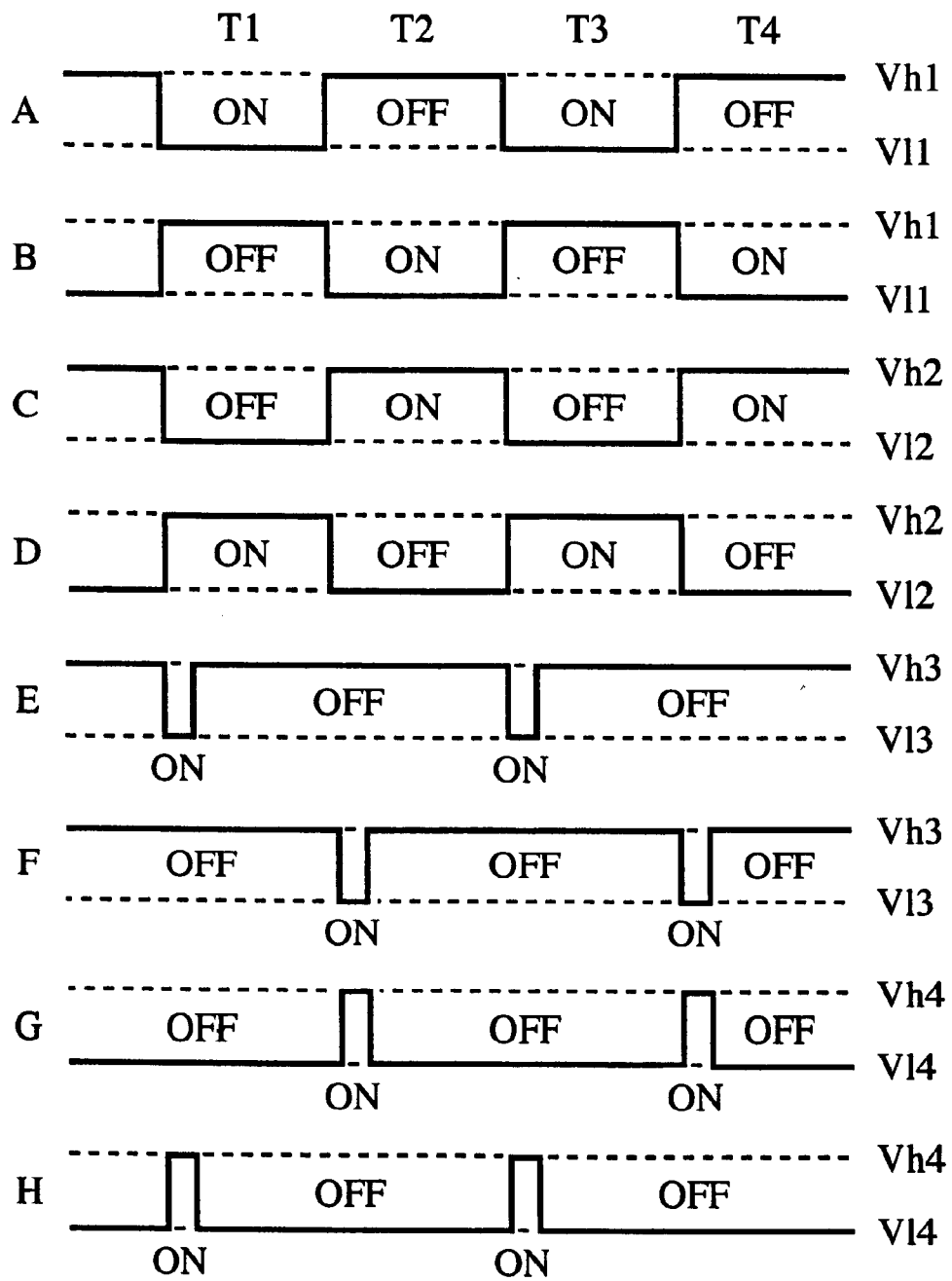
FIG. 7 is timing chart showing an operation of the current driver circuit shown in FIG. 6.

FIG. 7 is a timing chart showing an operation of the current driver circuit.

Next, an operation of the current driver circuit will be described below.

As shown in FIG. 6, the current source circuit comprising the transistors Tr17 to Tr28 is added to the current mirror circuit shown in FIG. 3 for the purpose of shortening the changing time (that is, the rise time Tr and the fall time Tf) required to change the flow direction of the write current Iwc. The current source circuit is operated only when the flow direction changing operation of the write current Iwc is started.

As shown in FIG. 7, when the flow of the write current Iwc in the right direction in FIG. 6 is started in each of the time periods T1 and T3, the transistors Tr21 and Tr23 are turned on and are set to the "on" state for a short time. Therefore, the transistor Tr17 set to the "on" state functions as a current source, a boost current (or a pulse current) is supplied from the transistor Tr17 to a node P between the resistor R1 and the write head WH (or the left end of the write head WH in FIG. 6), a portion of the boost current is used in the write head WH to heighten the change of the write current Iwc from the left flow direction to the right flow direction, and the other portion of the boost current is received in the transistors Tr19 and Tr23 respectively set to the "on" state. Also, when the flow of the write current Iwc in the left direction in FIG. 6 is started in each of the time periods T2 and T4, the transistors Tr22 and Tr24 are turned on and are set to the "on" state for a short time. Therefore, the transistor Tr18 set to the "on" state functions as a current source, a boost current (or a pulse current) is supplied from the transistor Tr18 to a node Q between the resistor R2 and the write head WH (or the eight end of the write head WH in FIG. 6), a portion of the boost current is used in the write head WH to heighten the change of the write current Iwc from the right flow direction to the left flow direction, and the other portion of the boost current is received in the transistors Tr20 and Tr24 respectively set to the "on" state.

Therefore, the changing time (that is, the rise time Tr or the fall time Tf) of the flow direction of the write current Iwc can be shortened as compared with that in the current driver circuit of the second embodiment shown in FIG. 3. Accordingly, the change of the flow direction of the write current Iwc can be heightened, and data can be accurately written to a magnetic disk (not shown) at a data transfer rate higher than that in the current driver circuit of the second embodiment.

Here, in dependence on the resistance value Rh of the resistors R1 and R2, the output impedance of the current mirror circuit is considerably larger than that of the source follower. Therefore, the impedance matching between the output impedance Z1 of the current supply circuit and the input impedance Zwh of the write head WH obtained in the second embodiment can be preferably maintained, and the impedance matching between the output impedance Zwh of the write head WH and the input impedance Z2 of the current receiving circuit obtained in the second embodiment can be preferably maintained.

EMBODIMENT 5

Figure 8:
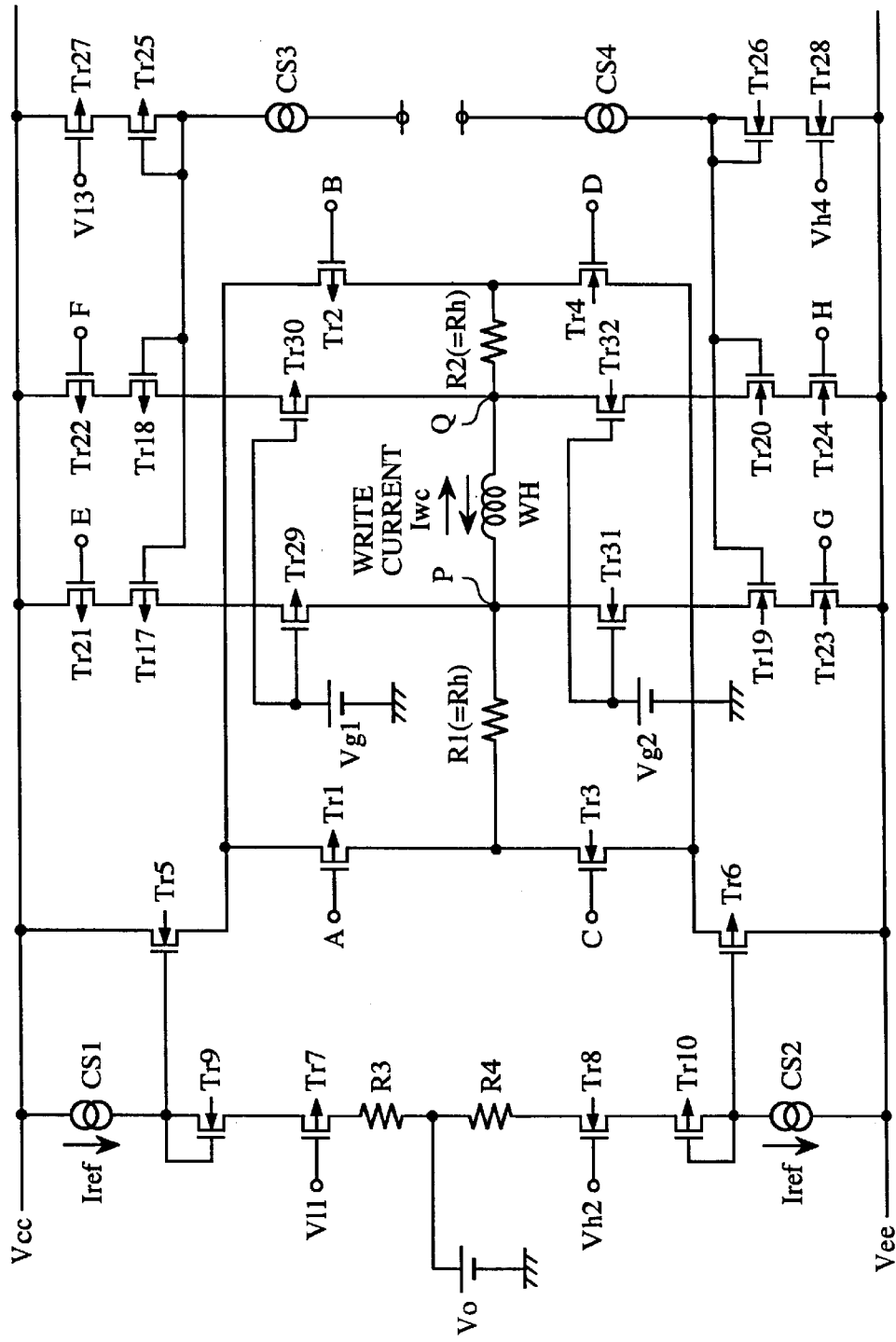
FIG. 8 is circuit view showing a current driver circuit according to a fifth embodiment of the present invention.
Figure 10:
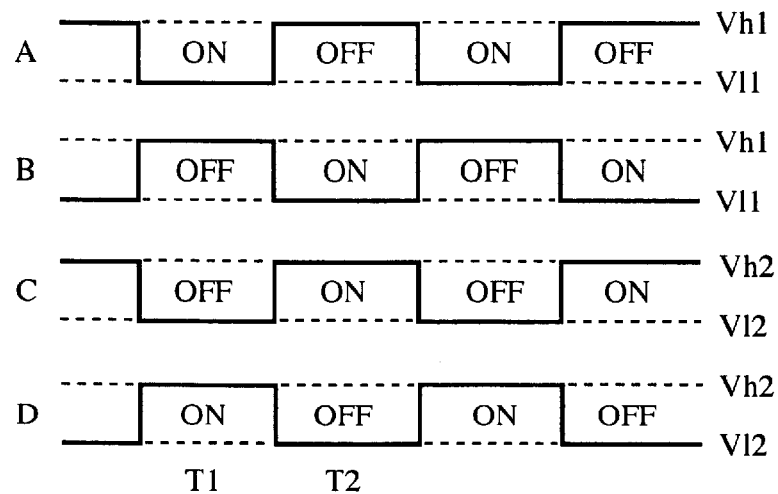
FIG. 10 is a timing chart showing an operation of the conventional current driver circuit shown in FIG. 9.
Figure 11:
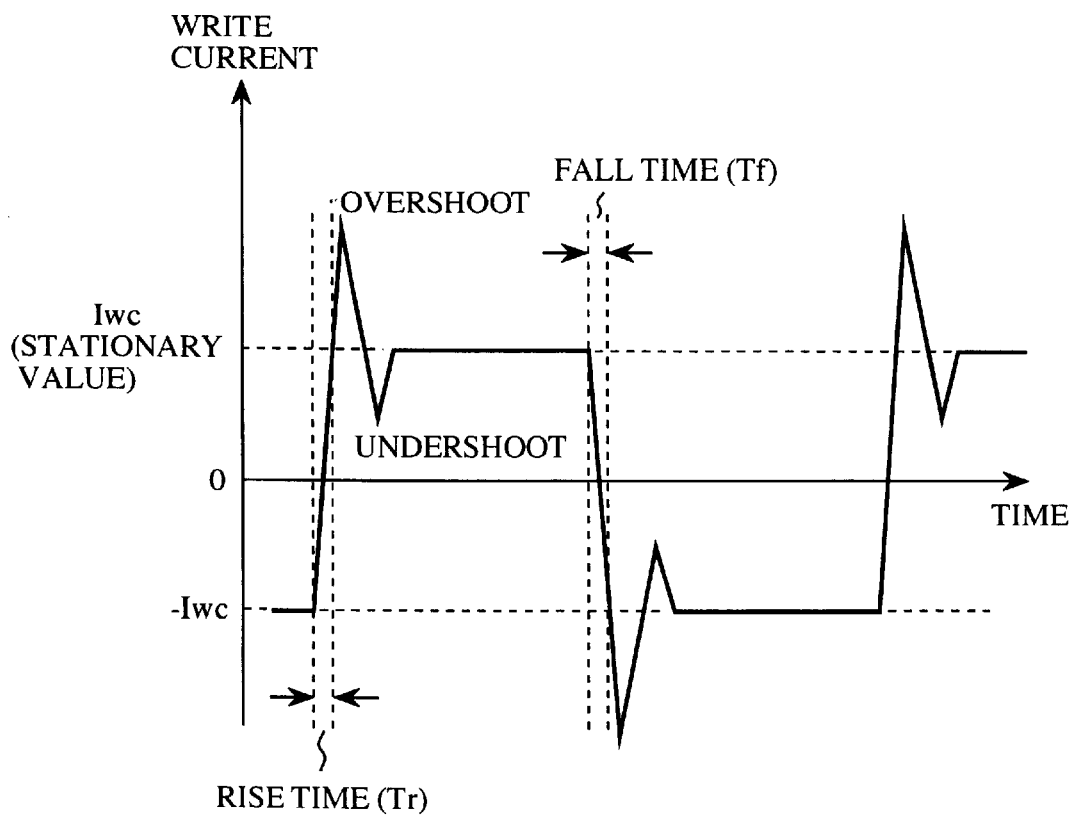
FIG. 11 shows a waveform view showing an undershoot phenomenon.

FIG. 8 is a circuit view showing a current driver circuit according to a fifth embodiment of the present invention. The constituent elements, which are the same as those shown in FIG. 6, are indicated by the same reference numerals as those of the constituent elements shown in FIG. 6, and additional description of those constituent elements is omitted.

In FIG. 8, Tr29 and Tr30 indicate gate-grounded transistors formed of PMOS transistors respectively, and Tr31 and Tr32 indicate gate-grounded transistors formed of NMOS transistors respectively. Vg1 and Vg2 indicate power sources respectively. The gates of the gate-grounded transistors Tr29 and Tr30 are connected with the power source Vg1, and the gates of the gate-grounded transistors Tr31 and Tr32 are connected with the power source Vg2. The source of the gate-grounded transistor Tr29 is connected with the drain of the transistor Tr17, and the drain of the gate-grounded transistor Tr29 is connected with the node P between the resistor R1 and the write head WH (or the left end of the write head WH in FIG. 8). The source of the gate-grounded transistor Tr30 is connected with the drain of the transistor Tr18, and the drain of the gate-grounded transistor Tr30 is connected with the node Q between the resistor R2 and the write head WH (or the right end of the write head WH in FIG. 8). The source of the gate-grounded transistor Tr31 is connected with the drain of the transistor Tr19, and the drain of the gate-grounded transistor Tr31 is connected with the left end of the write head WH. The source of the gate-grounded transistor Tr32 is connected with the drain of the transistor Tr20, and the drain of the gate-grounded transistor Tr32 is connected with the right end of the write head WH.

Next, an operation of the current driver circuit will be described below.

As is described in the third embodiment, the flyback voltage is applied between both ends P and Q of the write head WH each time the flow direction of the write current Iwc is changed. Because the flyback voltage is applied to the transistors Tr17 to Tr20, protective transistors are required for the transistors Tr17 to Tr20 to reduce values Vds of the transistors Tr17 to Tr20. Therefore, the transistors Tr29 to Tr32 are disposed as the protective transistors, and the electric potential difference Vds between the drain and the gate in each of the transistors Tr17 to Tr20 is reduced. Accordingly, adverse influence of the flyback voltage on the transistors Tr17 to Tr20 can be prevented.

Here, because the drains of the transistors Tr29 to Tr32 are connected to the ends of the write head WH, output resistances of the transistors Tr29 to Tr32 are almost the same as that of the current source circuit comprising the transistors Tr17 to Tr28 and are considerably larger than an output impedance of a source follower. Therefore, the transistors Tr29 to Tr32 hardly influence on both the impedance matching between the output impedance Z1 of the current supply circuit and the input impedance Zwh of the write head WH maintained according to the fourth embodiment and the impedance matching between the output impedance Zwh of the write head WH and the input impedance Z2 of the current receiving circuit maintained according to the fourth embodiment.

What is claimed is:

1. A current driver circuit comprising:

a first current source;

a first NMOS transistor having a drain connected to said first current source and a gate connected to the drain of said first NMOS transistor;

a second NMOS transistor coupled between a source of said first NMOS transistor and a first voltage, and having a gate receiving a first bias voltage;

a third NMOS transistor having a drain coupled to a first node and a gate connected to the gate of said first NMOS transistor, the first node being connected to a first end of an inductance element;

a fourth NMOS transistor coupled between a source of said third NMOS transistor and the first voltage, having a gate, and being turned on and off in response to a voltage applied to the gate;

a fifth NMOS transistor having a drain coupled to a second node and a gate connected to the gate of said first NMOS transistor, the second node being connected to a second end of the inductance element;

a sixth NMOS transistor coupled between a source of said fifth NMOS transistor and the first voltage, having a gate, and being turned on and off in response to a voltage applied to the gate;

a second current source;

a first PMOS transistor having a drain connected to said second current source and a gate connected to the drain of said first PMOS transistor;

a second PMOS transistor coupled between a source of said first PMOS transistor and a second voltage, and having a gate receiving a second bias voltage;

a third PMOS transistor having a drain coupled to the first node and a gate connected to the gate of said first PMOS transistor;

a fourth PMOS transistor coupled between a source of said third PMOS transistor and the second voltage, having a gate, and being turned on and off in response to a voltage applied to the gate;

a fifth PMOS transistor having a drain coupled to the second node and a gate connected to the gate of said first PMOS transistor; and a sixth PMOS transistor coupled between a source of said fifth PMOS transistor and the second voltage, having a gate, and being turned on and off in response to a voltage applied to the gate.

2. The current driver circuit according to claim 1, further comprising:

a seventh NMOS transistor coupled between the first voltage and the first node via said third and fourth NMOS transistors, and having a gate receiving a third bias voltage;

eighth NMOS transistor coupled between the first voltage and the second node via said fifth and sixth NMOS transistors, and having a gate connected to the gate of said seventh NMOS transistors;

a seventh PMOS transistor coupled between the second voltage and the first node via said third and fourth PMOS transistors, and having a gate receiving a fourth bias voltage; and an eighth PMOS transistor coupled between the second voltage and the second node via said fifth and sixth PMOS transistors, and having a gate connected to the gate of said seventh PMOS transistors.

3. The current driver circuit according to claim 1, further comprising:

a first resistor connected to the first node for impedance matching to input and output impedances of the inductance element; and a second resistor connected to the second node for the impedance matching.

* * * * *